(12) United States Patent
Ebiike et al.

(10) Patent No.: US 12,484,238 B2
(45) Date of Patent: Nov. 25, 2025

(54) SEMICONDUCTOR APPARATUS

(71) Applicant: Mitsubishi Electric Corporation, Tokyo (JP)

(72) Inventors: Yuji Ebiike, Tokyo (JP); Shigeto Honda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 443 days.

(21) Appl. No.: 18/062,862

(22) Filed: Dec. 7, 2022

(65) Prior Publication Data

US 2023/0387278 A1 Nov. 30, 2023

(30) Foreign Application Priority Data

May 26, 2022 (JP) .................................. 2022-086257

(51) Int. Cl.
*H10D 12/00* (2025.01)
*H10D 1/20* (2025.01)
*H10D 8/00* (2025.01)

(52) U.S. Cl.
CPC ............. *H10D 12/481* (2025.01); *H10D 1/20* (2025.01); *H10D 8/00* (2025.01)

(58) Field of Classification Search
CPC ........... H10D 12/481; H10D 8/00; H10D 1/20
USPC ....................................................... 257/140
See application file for complete search history.

(56) References Cited

U.S. PATENT DOCUMENTS

| | | | |
|---|---|---|---|
| 2014/0209972 A1 | 7/2014 | Sumitomo et al. | |
| 2018/0026628 A1 | 1/2018 | Lu et al. | |
| 2018/0062634 A1* | 3/2018 | Shin | H03K 17/90 |
| 2018/0183432 A1* | 6/2018 | Kondo | H03K 17/74 |
| 2021/0044260 A1* | 2/2021 | Zeng | H03F 1/56 |
| 2021/0273088 A1* | 9/2021 | Basler | H10D 64/64 |

FOREIGN PATENT DOCUMENTS

| | | |
|---|---|---|
| JP | S61-251379 A | 11/1986 |
| JP | 2013-098415 A | 5/2013 |

OTHER PUBLICATIONS

An Office Action; "Notice of Reasons for Refusal," mailed by the Japanese Patent Office on Feb. 12, 2025, which Corresponds to Japanese Patent Application No. 2022-086257 and is related to U.S. Appl. No. 18/062,862; with English language translation.

* cited by examiner

*Primary Examiner* — Igwe U Anya
(74) *Attorney, Agent, or Firm* — Studebaker Brackett PLLC

(57) ABSTRACT

According to the present disclosure, a semiconductor apparatus comprises a first gate electrode; a second gate electrode connected in parallel with the first gate electrode; a control circuit connected to the first gate electrode and the second gate electrode and configured to control gate voltages; and a coil connected between the second gate electrode and the control circuit.

19 Claims, 7 Drawing Sheets

SEMICONDUCTOR APPARATUS

BACKGROUND OF THE INVENTION

Field

The present disclosure relates to a semiconductor apparatus.

Background

To achieve energy saving of power electronic equipment such as an inverter, it is necessary to reduce a loss of a semiconductor switching device. Examples of the semiconductor switching device can include an insulated gate bipolar transistor (IGBT) and a metal oxide semiconductor field effect transistor (MOSFET). The loss is determined by a conduction loss and a switching loss of the device, and thus, development is underway for the purpose of achieving a further lower loss of the switching device by reducing the conduction loss and the switching loss.

In particular, in a bipolar transistor such as an IGBT, values of a turn-off loss which is part of a switching loss, and a conduction loss can be controlled by adjusting the amount of minority carriers during on time. However, in a semiconductor apparatus, the switching loss and the conduction loss have a trade-off relationship, and thus, there is a problem that it is difficult to achieve reduction of both the losses.

To solve this problem, JP 2013-98415 A discloses a semiconductor apparatus in which a switching loss is improved by improving a turn-off loss. In this semiconductor apparatus, two gate electrodes included in the same chip are controlled by different gate control signal circuits. Further, by shifting the timing at which each gate is turned off upon turn-off, discharge of minority carriers from the gate that is turned off first partially precedes discharge from the other gate. This results in improving the turn-off loss.

However, with the above-described method, there is a problem that a control circuit and a control method become complicated to individually control the two gate electrodes.

SUMMARY

In view of the above-described problems, an object of the present disclosure is to provide a semiconductor apparatus that can achieve reduction in a switching loss without making a control circuit and a control method complicated by connecting a coil only to one of two gate electrodes.

The features and advantages of the present disclosure may be summarized as follows.

A semiconductor apparatus according to the present disclosure includes: a first gate electrode; a second gate electrode connected in parallel with the first gate electrode; a control circuit connected to the first gate electrode and the second gate electrode and configured to control gate voltages; and a coil connected between the second gate electrode and the control circuit.

Other and further objects, features and advantages of the disclosure will appear more fully from the following description.

DESCRIPTION OF EMBODIMENTS

First Embodiment

Figure 1:
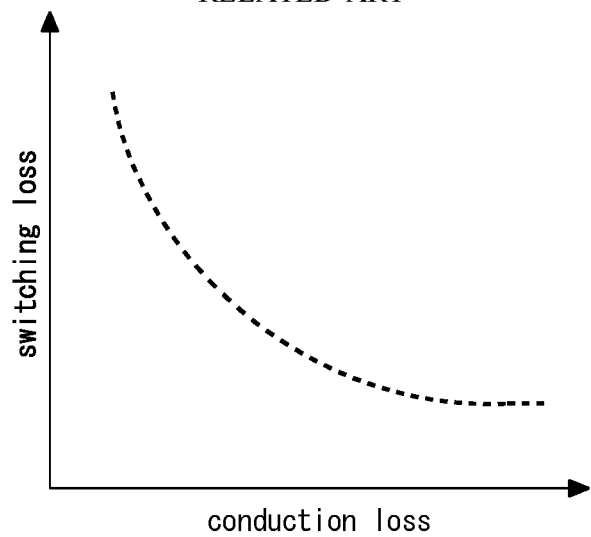
FIG. 1 is a graph indicating a relationship between a switching loss and a conduction loss

Before a description of a first embodiment, effects and problems of the related art will be described. FIG. 1 is a graph indicating a relationship between a switching loss and a conduction loss. It can be seen that the switching loss and the conduction loss have a trade-off relationship.

A semiconductor apparatus in JP 2013-98415 A includes a normal gate electrode and a control gate electrode. The semiconductor apparatus is an n-channel IGBT, and thus, holes are accumulated in a drift layer upon turn-off. After turn-off, the holes are required to be discharged, which causes a switching loss.

In this semiconductor apparatus, these two gate electrodes are individually controlled to shift timings of turn-off, thereby part of the holes are discharged in advance. As a result, fewer holes are required to be discharged when all the gate electrodes are turned off, so that the switching loss can be reduced.

In the semiconductor apparatus in the related art, a switching loss is improved by controlling holes upon turn-off by individually controlling a plurality of gate electrodes in this manner. However, a problem arises that individual control of the plurality of gate electrodes makes a control circuit and a control method complicated. To solve the problem, the present disclosure provides a semiconductor apparatus in which a plurality of gate electrodes are controlled by a simple control circuit and control method.

Figure 2:
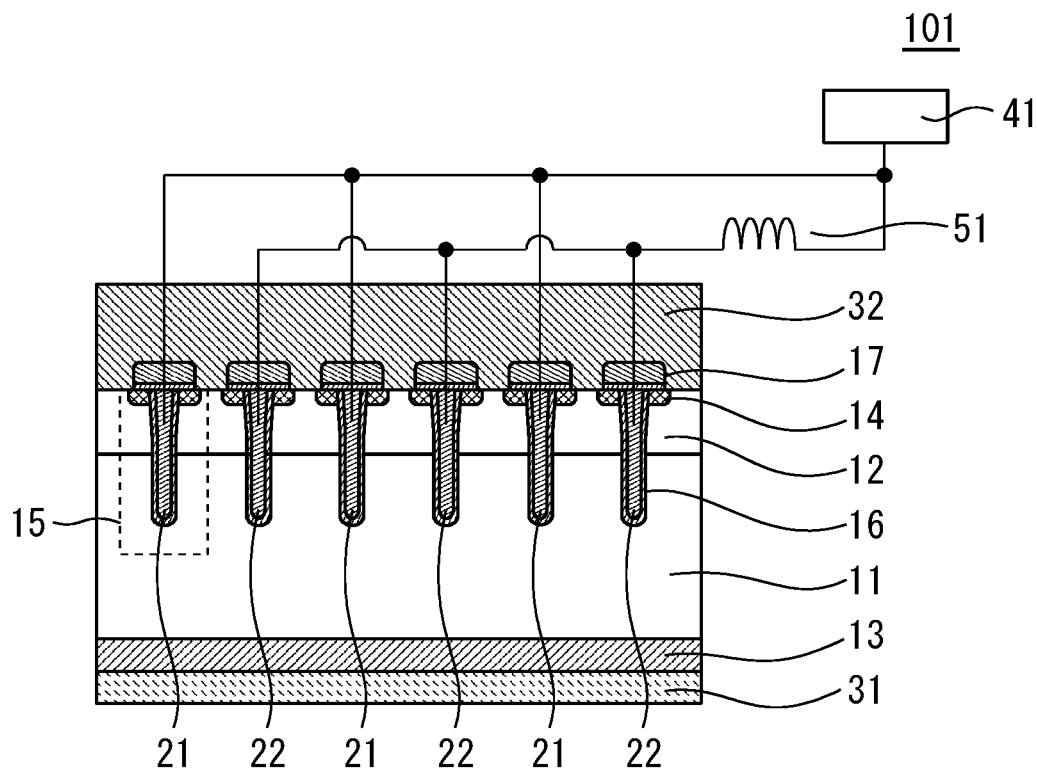
FIG. 2 is a plan view of a modification of the pushing-up block according to the first embodiment of the present disclosure.

FIG. 2 is a cross-section view of a semiconductor apparatus and a view illustrating a control circuit of the semiconductor apparatus according to the first embodiment of the present disclosure. The semiconductor apparatus 101 is specifically, an n-channel IGBT.

The semiconductor apparatus 101 includes an n-type drift layer 11. A p-type base layer 12 is formed on the drift layer 11. A plurality of n-type emitter layers 14 are formed on a surface layer of the base layer 12.

Further, the semiconductor apparatus 101 includes trenches 15. The trenches 15 are formed so as to penetrate the base layer 12 and reach the drift layer 11. Inside of the trenches 15, first gate electrodes 21 and second gate electrodes 22 are formed via gate insulating films 16. Interlayer dielectrics 17 are formed on the first gate electrodes 21 and the second gate electrodes 22 to separate gates and emitters. An emitter electrode 32 is formed on the interlayer dielectrics 17. The emitter electrode 32 contacts the base layer 12 and the emitter layers 14.

The semiconductor apparatus 101 includes a p-type collector layer 13. The collector layer 13 is formed under the drift layer 11, and a collector electrode 31 is formed under the collector layer 13.

Further, the semiconductor apparatus 101 includes a control circuit 41. The control circuit 41 is connected to the first and the second gate electrodes to control the gate voltage of the IGBT. A coil 51 is connected between the second gate electrodes 22 and the control circuit 41.

Figure 3:
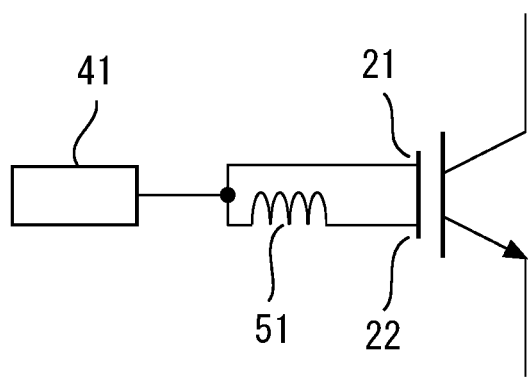
FIG. 3 is a view illustrating an equivalent circuit of the semiconductor apparatus according to the first embodiment of the present disclosure.

FIG. 3 is a view illustrating an equivalent circuit of the semiconductor apparatus according to the first embodiment of the present disclosure. As described above, in the semiconductor apparatus 101, the coil 51 is connected between the second gate electrodes 22 and the control circuit 41. A coil is not connected between the first gate electrodes 21 and the control circuit 41.

Figure 4:
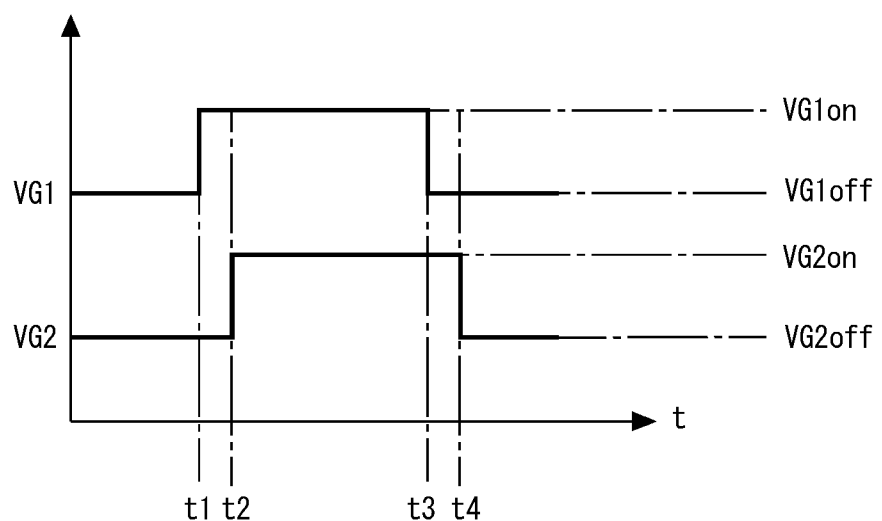
FIG. 4 is a graph indicating voltages to be applied to the gate electrodes of the semiconductor apparatus according to the first embodiment of the present disclosure.

FIG. 4 is a graph indicating voltages to be applied to the gate electrodes of the semiconductor apparatus according to the first embodiment of the present disclosure. Switching operation of the semiconductor apparatus 101 will be described using FIG. 4.

VG1 in the graph indicates a voltage to be applied to the first gate electrode, and VG2 indicates a voltage to be applied to the second gate electrode. A vertical axis indicates values of the voltages, VG1on and VG2on indicate values of voltages upon gate-on, and VG1off and VG2off indicate values of voltages upon gate-off. Values of VG1on and VG2on are set at, for example, 15 V, and values of VG1off and VG2off are set at, for example, 0 V. A horizontal axis indicates time, t1 and t2 respectively indicate time at which VG1 and VG2 are turned on, and t3 and t4 respectively indicate time at which VG1 and VG2 are turned off. Operation of transitioning from VG1off to VG1on, and from VG2off to VG2on will be referred to as turn-on, and inversely, operation of transitioning from VG1on to VG1off, and from VG2on to VG2off will be referred to as turn-off.

If power is supplied from the control circuit 41 to the first and the second gate electrodes, the gates are turned on, and the voltages of VG1 and VG2 rise to VG1on and VG2on. On the other hand, if power supply is stopped, the gates are turned off, and the voltages of VG1 and VG2 decrease to VG1off and VG2off.

Here, the coil 51 is connected to the second gate electrodes, and thus, a delay occurs in a gate signal. Thus, a delay period of t4−t3 occurs in a period from VG1off to VG2off. This operation enables individual control of timings for turning off the gates without using a plurality of control circuits, so that it is possible to improve a turn-off loss.

Note that while voltages of VG1 and VG2 upon on time and upon off time are indicated with rectangular waves for convenience sake, there is a case where the voltages have distorted waveforms due to capacitance characteristics of the semiconductor apparatus, inductance of the coil and other parasitic impedance. However, these waveforms can be adjusted as appropriate by design of the semiconductor apparatus and circuits.

Second Embodiment

Figure 5:
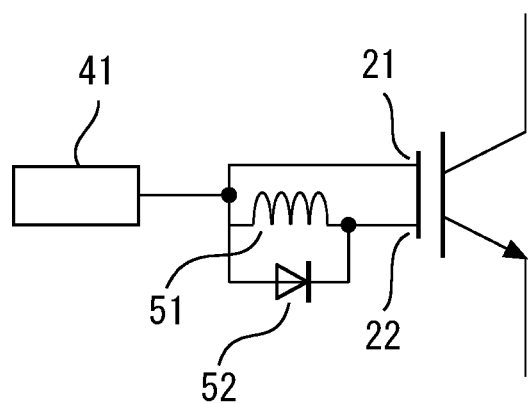
FIG. 5 is a view illustrating an equivalent circuit of a semiconductor apparatus according to a second embodiment of the present disclosure.

FIG. 5 is a view illustrating an equivalent circuit of a semiconductor apparatus according to a second embodiment of the present disclosure. A semiconductor apparatus 102 according to the second embodiment is different from the semiconductor apparatus in the first embodiment in that a diode 52 for gate control is connected in parallel to the coil 51. An anode side of the diode 52 is connected to the control circuit 41, and a cathode side of the diode 52 is connected to the second gate electrode 22.

Figure 6:
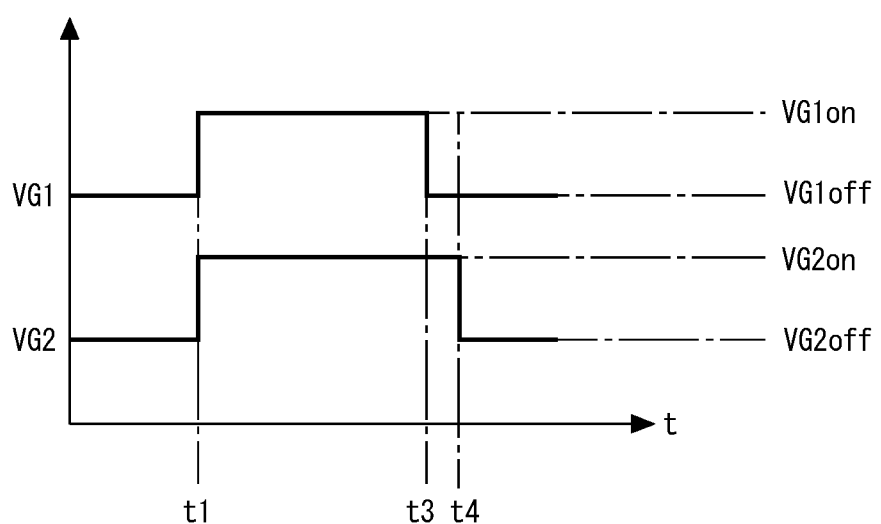
FIG. 6 is a graph indicating voltages to be applied to gate electrodes of the semiconductor apparatus according to the second embodiment of the present disclosure.

FIG. 6 is a graph indicating voltages to be applied to gate electrodes of the semiconductor apparatus according to the second embodiment of the present disclosure. Switching operation of the semiconductor apparatus 102 will be described using FIG. 6.

In the first embodiment, a delay period occurs upon turn-on as well as upon turn-off due to the influence of the coil 51. However, in the second embodiment, power is supplied to the second gate electrode through the diode 52 upon turn-on. Thus, the influence of the coil is reduced, so that a delay period upon turn-on can be resolved. This results in improving a turn-off loss without affecting a turn-on loss, so that it is possible to improve a switching loss.

Figure 7:
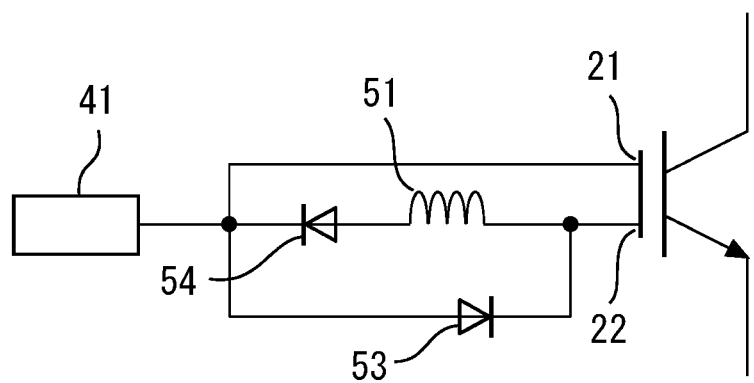
FIG. 7 is a view illustrating an equivalent circuit of a semiconductor apparatus according to a first modification of the second embodiment of the present disclosure.

FIG. 7 is a view illustrating an equivalent circuit of a semiconductor apparatus according to a first modification of the second embodiment of the present disclosure. A semiconductor apparatus 102a is the same as the semiconductor apparatus 102 in that a diode 53 is connected in parallel to the coil 51 but is different from the semiconductor apparatus 102 in that a diode 54 is connected in series with the coil 51. An anode side of the diode 54 is connected to the second gate electrode 22, and a cathode side of the diode 54 is connected to the control circuit 41.

Operation when power is applied to the gates in the semiconductor apparatus 102 is strictly operation by a parallel circuit of the coil 51 and the diode 52. Thus, the coil 51 affects rising of VG2 upon turn-on.

On the other hand, when power is applied to the semiconductor apparatus 102a, it is possible to prevent power supply from the coil side to the second gate electrode 22 by the diode 54. It is therefore possible to reduce influence of the coil 51 to be provided to rising of VG2 upon turn-on.

Figure 8:
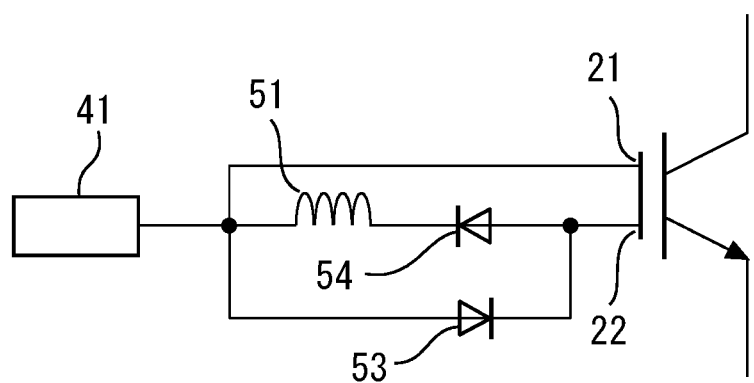
FIG. 8 is a view illustrating an equivalent circuit of a semiconductor apparatus according to a second modification of the second embodiment of the present disclosure.

FIG. 8 is a view illustrating an equivalent circuit of a semiconductor apparatus according to a second modification of the second embodiment of the present disclosure. A semiconductor apparatus 102b is different from the semiconductor apparatus 102a in that a position of the coil 51 is exchanged with a position of the diode 54. Also in this case, effects similar to the effects of the semiconductor apparatus 102a are exerted, so that it is possible to reduce influence to be provided to rising of VG2 upon turn-on.

Note that one or all of the diodes 52, 53 and 54 may be a built-in diode. This can eliminate the need to externally attach the diode, so that it is possible to reduce a size of the semiconductor apparatus.

Third Embodiment

Figure 9:
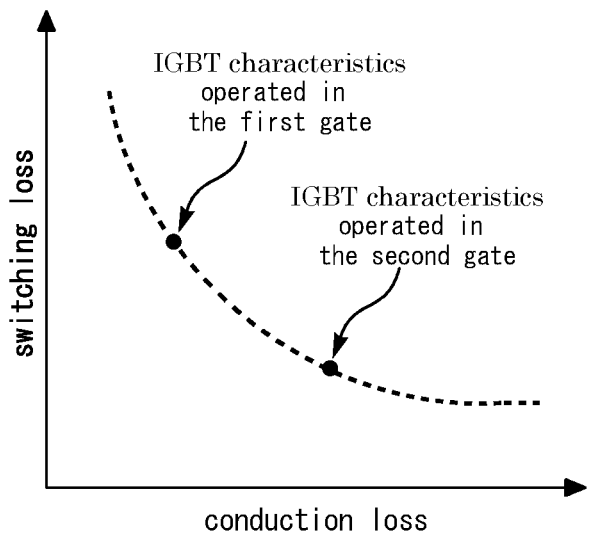
FIG. 9 is a view illustrating IGBT characteristics of gate electrodes according to a third embodiment of the present disclosure.

FIG. 9 is a view illustrating IGBT characteristics of gate electrodes according to a third embodiment of the present disclosure. The third embodiment is different from the first embodiment and the second embodiment in that IGBTs having different characteristics are used as semiconductor device regions to be controlled by two gate electrodes to effectively improve a loss of the semiconductor apparatus.

In the semiconductor apparatus according to the third embodiment, the IGBT operating in the first gate electrode is designed to have characteristics of a relatively low conduction loss and a relatively high switching loss. On the other hand, the IGBT operating in the second gate electrode is designed to have characteristics of a relatively high conduction loss and a relatively low switching loss.

In the IGBTs, a conduction loss is reduced by increasing an accumulation amount of minority carriers. As a result, minority carriers that perform discharging upon turn-off increase, which results in increasing a switching loss. This is a cause of a trade-off relationship between the conduction loss and the switching loss.

In the third embodiment, a conduction loss is reduced by designing the first gate electrode to have IGBT characteristics of a relatively low conduction loss and actively utilizing the IGBT characteristics upon on time. Subsequently, a loss related to carrier discharge is reduced by cutting off the first gate electrode first. In this event, the conduction loss becomes temporarily high by the IGBT characteristics of the second gate electrode with a relatively low conduction loss. However, a period during which the conduction loss becomes high is a short period, and thus, this high conduction loss has a low impact.

Further, subsequently, the second gate electrode is cut off. In this event, the first gate electrode with a relatively high switching loss has already been cut off, and thus, carrier discharge progresses first. Thus, the switching loss is more affected by the second gate electrode as a whole. The second gate electrode has a relatively low switching loss, and thus, the switching loss is reduced as a whole. As described above, according to the third embodiment, it is possible to achieve both reduction in the conduction loss and reduction in the switching loss of the IGBT.

Examples of a method for changing IGBT characteristics for each region can include the following four methods. The first method is a method in which concentration of the collector layer 13 is changed. Specifically, the conduction loss is reduced by relatively lowering impurity concentration of the collector layer in an IGBT region operating in the first gate electrode.

The second method is a method in which a carrier accumulation layer is partially formed under the base layer using a publicly known technique. Specifically, the conduction loss is reduced by partially forming an n-type carrier accumulation layer in an IGBT region operating in the first gate electrode. Alternatively, the conduction loss is reduced by forming a carrier accumulation layer in all the regions and relatively increasing impurity concentration for a carrier accumulation layer in an IGBT region operating in the first gate electrode.

The third method is a method in which lifetimes of the minority carriers are locally shortened for an IGBT region operating in the second gate electrode. Specifically, the lifetimes of the minority carriers are locally shortened by selectively injecting lifetime killers such as electron beams in an IGBT region operating in the second gate electrode.

The fourth method is a method in which an interval of trenches in an IGBT region operating in the second gate electrode is made relatively larger.

Fourth Embodiment

Figure 10:
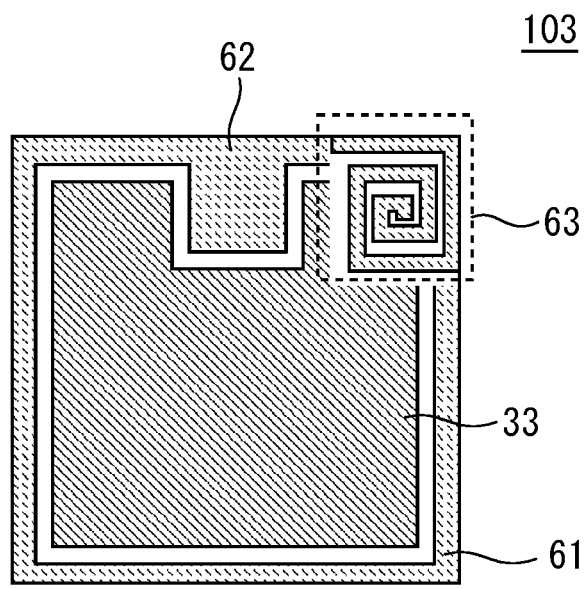
FIG. 10 is a view illustrating a top view of an IGBT included in a semiconductor apparatus in a fourth embodiment of the present disclosure.

FIG. 10 is a view illustrating a top view of an IGBT included in a semiconductor apparatus in a fourth embodiment of the present disclosure. The fourth embodiment is different from the first embodiment in that a built-in coil 63 is used in place of the coil 51.

The semiconductor apparatus 103 includes an emitter electrode 33. The emitter electrode 33 corresponds to the emitter electrode 32 of the semiconductor apparatus 101. Further, the semiconductor apparatus 103 includes a gate wiring 61. The gate wiring 61 is electrically connected to the first gate electrode while penetrating the emitter electrode and the interlayer dielectric. Further, the semiconductor apparatus 103 includes the built-in coil 63. The built-in coil 63 is electrically connected to the second gate electrode and corresponds to the coil 51 of the semiconductor apparatus 101.

Further, the semiconductor apparatus 103 includes a gate pad 62. The gate pad 62 is electrically connected to the gate wiring 61 and the built-in coil 63 and is connected to the control circuit 41 in the semiconductor apparatus 101. According to such a configuration, it is possible to implement a configuration similar to the configuration of the first embodiment without using an external coil.

Further, as indicated in the semiconductor apparatus 102a and the semiconductor apparatus 102b, a diode may be a built-in diode that is incorporated on a chip and may be connected to the built-in coil, the gate electrode, and the gate pad. The built-in diode can be formed by, for example, doping polysilicon with n-type or p-type impurities. This eliminates the need to externally attach a diode, so that it is possible to reduce a size of the system.

Figure 11:
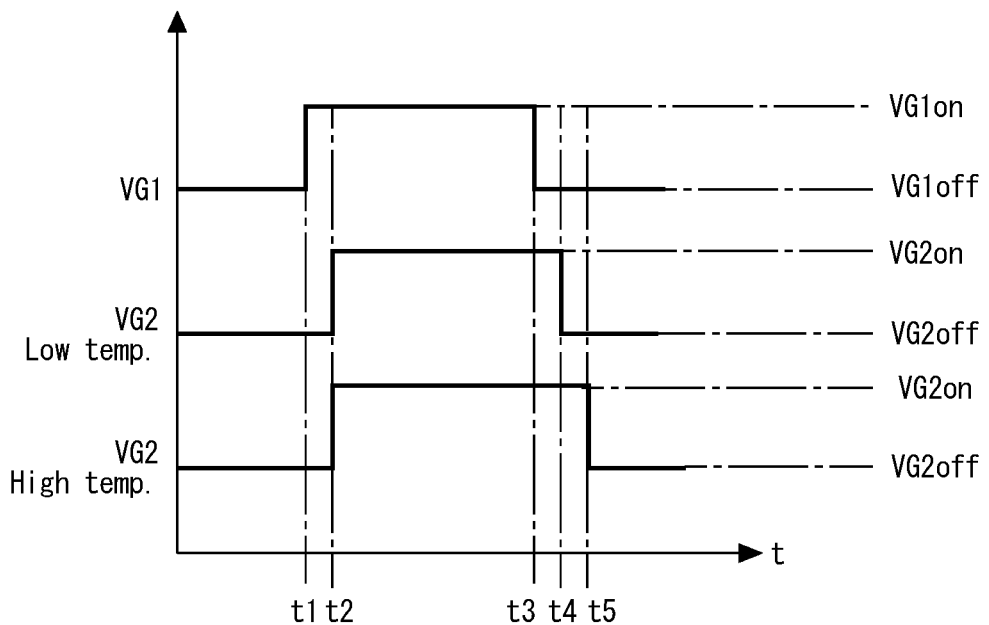
FIG. 11 is a graph indicating voltages to be applied to gate electrodes of a semiconductor apparatus according to the fourth embodiment of the present disclosure.

FIG. 11 is a graph indicating voltages to be applied to gate electrodes of a semiconductor apparatus according to the fourth embodiment of the present disclosure. t3, t4 and t5 respectively indicate time at which VG1, VG2 during low-temperature operation and VG2 during high-temperature operation are turned off. It can be seen that t5–t3 is longer than t4–t3, because t5 is later than t4.

Typically, a switching loss during high-temperature operation of the IGBT is larger than a switching loss during low-temperature operation. Thus, the switching operation of the fourth embodiment is designed so that a delay period from VG1off to VG2off during high-temperature operation becomes longer than a delay period during low-temperature operation. By implementing such operation, it is possible to reduce a loss that becomes large during high-temperature operation.

The above-described effect can be achieved by using a coil having inductance having positive temperature dependence. This can be achieved by, for example, using a metal such as Al, Cu, Ti, Ni, Mo, W and Ta and nitrides thereof. Alternatively, this can be achieved by using a laminated film constituted with these metals or nitrides or alloy layers thereof. Particularly, in a structure in which the coil is incorporated on the same chip as in the fourth embodiment, such operation can be implemented because the coil becomes a high temperature when the semiconductor apparatus becomes a high temperature.

Fifth Embodiment

Figure 12:
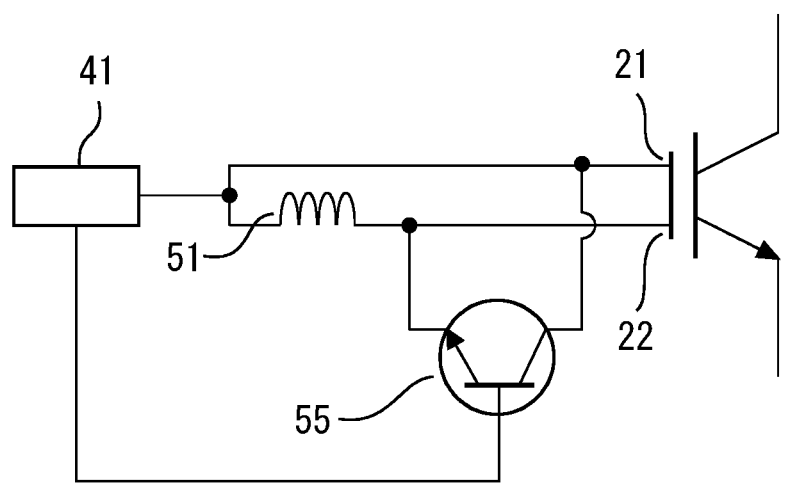
FIG. 12 is a view illustrating an equivalent circuit of a semiconductor apparatus in a fifth embodiment of the present disclosure.

FIG. 12 is a view illustrating an equivalent circuit of a semiconductor apparatus in a fifth embodiment of the present disclosure. The semiconductor apparatus 104 according to the fifth embodiment is different from the semiconductor apparatus in the first embodiment in that a protection device 55 is connected between the first gate electrode 21 and the second gate electrode 22.

When an accident such as a short circuit occurs in a switching device like an IGBT, a gate is cut off through operation by the protection circuit. In this event, in the semiconductor apparatus according to the first embodiment, a delay occurs on the second gate electrode side due to the influence of the coil. Thus, in the semiconductor apparatus according to the fifth embodiment, the protection device is connected on the second gate electrode side. By this means, the first gate electrode 21 is electrically connected to the second gate electrode 22 upon cutting-off operation, so that it is possible to provide an effect of preventing occurrence of a delay.

Sixth Embodiment

Figure 13:
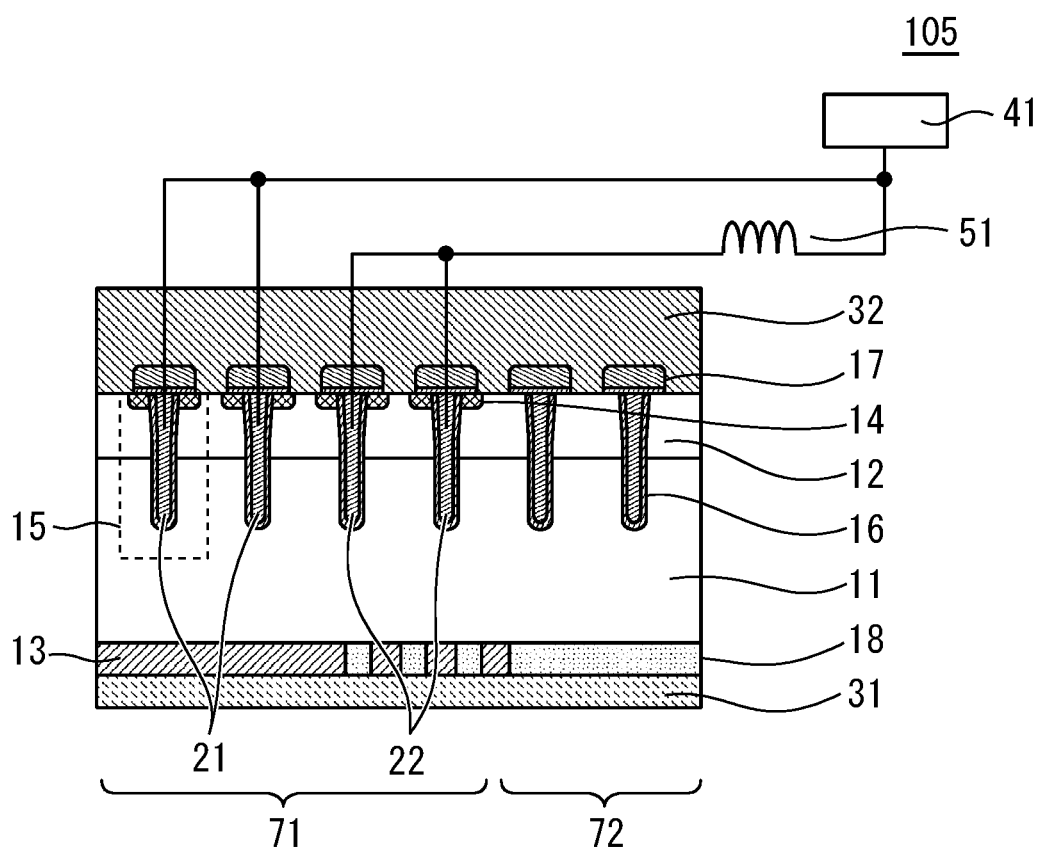
FIG. 13 is a cross-section view of a semiconductor apparatus and a view illustrating a control circuit of the semiconductor apparatus according to a sixth embodiment of the present disclosure.

FIG. 13 is a cross-section view of a semiconductor apparatus and a view illustrating a control circuit of the semiconductor apparatus according to a sixth embodiment of the present disclosure. A semiconductor apparatus 105 is a semiconductor device called RC-IGBT in which an IGBT region 71 and a diode region 72 are formed in parallel within the same device. In the diode region 72, a cathode layer 18 formed under the drift layer 11 functions as a cathode, and the base layer 12 formed on the drift layer 11 functions as an anode.

On the other hand, the cathode layer 18 is formed also in part of the IGBT region of the second gate electrode 22. The cathode layer is typically formed using a publicly known photoengraving technique and ion implantation technique. However, in this event, by forming the cathode layer also in part of the IGBT region 71 of the second gate electrode 22, substantial collector concentration can be reduced. By this means, it is possible to implement adjustment of the IGBT characteristics as described in the third embodiment without an additional process.

Note that in the present disclosure, while the IGBT and the RC-IGBT including the first and the second gate electrodes have been described in the first to the sixth embodiments, it is also possible to employ an aspect where third and subsequent gate electrodes are provided or an aspect where coils having a plurality of different kinds of inductance are connected. Further, similar control is possible also for a publicly known multi-gate IGBT having third or subsequent gate electrodes.

Further, other semiconductor devices may be connected between the control circuit and the gate electrodes in accordance with desired characteristics. Examples of other semiconductor devices can include a gate resistor, a capacitor, and the like. These may be connected in parallel or in series, may be incorporated on the same device or may be connected as different devices.

Note that the semiconductor apparatus of the present disclosure may include a wideband gap semiconductor. The wideband gap semiconductor is, for example, silicon carbide, gallium nitride material or diamond.

Obviously many modifications and variations of the present disclosure are possible in the light of the above teachings. It is therefore to be understood that within the scope of the appended claims the invention may be practiced otherwise than as specifically described.

The entire disclosure of a Japanese Patent Application No. 2022-86257, filed on May 26, 2022 including specification, claims, drawings and summary, on which the Convention priority of the present application is based, are incorporated herein by reference in its entirety.

The invention claimed is:

1. A semiconductor apparatus comprising:
   a first gate electrode;
   a second gate electrode connected in parallel with the first gate electrode;
   a control circuit connected to the first gate electrode and the second gate electrode and configured to control gate voltages; and
   a coil connected between the second gate electrode and the control circuit, without any coil positioned in a conductive path between the first gate electrode and the control circuit.

2. The semiconductor apparatus according to claim 1, further comprising a transistor region including:
   a first conductive type drift layer;
   a second conductive type base layer formed on a first principal surface of the drift layer;
   a second conductive type collector layer formed on a second principal surface of the drift layer;
   a first conductive type emitter layer formed in a surface layer portion of the base layer;
   a plurality of trenches penetrating the base layer and the emitter layer and reaching the drift layer;
   a gate insulating film formed on wall surfaces of the plurality of trenches;
   a collector electrode electrically connected to the collector layer; and
   an emitter electrode electrically connected to the emitter layer,
   wherein the first gate electrode and the second gate electrode are formed on the gate insulating film.

3. The semiconductor apparatus according to claim 2, further comprising
   a diode region formed in parallel with the transistor region within the same device.

4. The semiconductor apparatus according to claim 3, wherein a cathode layer provided in the diode region is formed in the collector layer.

5. The semiconductor apparatus according to claim 1, further comprising
   a first diode connected in parallel with the coil and including a cathode on a side of the second gate electrode and an anode on a side of the control circuit.

6. The semiconductor apparatus according to claim 5, incorporating the first diode.

7. The semiconductor apparatus according to claim 5, further comprising
   a second diode connected in series with the coil and including an anode on a side of the second gate electrode and a cathode on a side of the control circuit.

8. The semiconductor apparatus according to claim 7, incorporating the second diode.

9. The semiconductor apparatus according to claim 1,
   wherein a semiconductor device region to be controlled by the first gate electrode has characteristics of a relatively low conduction loss and a relatively high switching loss, and
   a semiconductor device region to be controlled by the second gate electrode has characteristics of a relatively high conduction loss and a relatively low switching loss.

10. The semiconductor apparatus according to claim 1, wherein the coil is a built-in coil.

11. The semiconductor apparatus according to claim 1, wherein the coil exhibits inductance characteristics having positive temperature dependence.

12. The semiconductor apparatus according to claim 1, further comprising
a protection device connecting the first gate electrode and the second gate electrode.

13. The semiconductor apparatus according to claim 1, wherein the semiconductor apparatus includes a wideband gap semiconductor.

14. The semiconductor apparatus according to claim 13, wherein the wideband gap semiconductor is silicon carbide, gallium nitride material or diamond.

15. A semiconductor apparatus comprising:
a first gate electrode;
a second gate electrode connected in parallel with the first gate electrode;
a control circuit connected to the first gate electrode and the second gate electrode and configured to control gate voltages;
a coil connected between the second gate electrode and the control circuit; and
a first diode connected in parallel with the coil and including a cathode on a side of the second gate electrode and an anode on a side of the control circuit.

16. The semiconductor apparatus according to claim 15, incorporating the first diode.

17. The semiconductor apparatus according to claim 15, further comprising
a second diode connected in series with the coil and including an anode on a side of the second gate electrode and a cathode on a side of the control circuit.

18. The semiconductor apparatus according to claim 17, incorporating the second diode.

19. A semiconductor apparatus comprising:
a first gate electrode;
a second gate electrode connected in parallel with the first gate electrode;
a control circuit connected to the first gate electrode and the second gate electrode and configured to control gate voltages; and
a coil connected between the second gate electrode and the control circuit,
wherein a semiconductor device region to be controlled by the first gate electrode has characteristics of a relatively low conduction loss and a relatively high switching loss, and
a semiconductor device region to be controlled by the second gate electrode has characteristics of a relatively high conduction loss and a relatively low switching loss.

* * * * *